(12) United States Patent
Cooper

(10) Patent No.: US 6,788,226 B1
(45) Date of Patent: Sep. 7, 2004

(54) DATA COMPRESSOR WITH STRING CODE REASSIGNMENT UTILIZING SWITCHED INPUT COINCIDENCE ELEMENTS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/644,529

(22) Filed: Aug. 20, 2003

(51) Int. Cl.[7] .............................................. H03M 7/00
(52) U.S. Cl. ........................................ 341/50; 341/51
(58) Field of Search ............................. 341/50, 51, 67

(56) References Cited

U.S. PATENT DOCUMENTS 6,674,374 B1 * 1/2004 Cooper ........................ 341/51

* cited by examiner

*Primary Examiner*—Brian Young
*Assistant Examiner*—Joseph Lauture
(74) *Attorney, Agent, or Firm*—Albert B. Cooper; Mark T. Starr; Michael B. Atlass

(57) ABSTRACT

A matrix of AND-gates correspond to respective codes to be assigned to strings. The outputs of the AND-gates are selectively coupled to prefix code inputs of the AND-gates through a prefix code matrix switch. A plurality of characters from the input stream are fetched into an input character buffer and applied through respective character decoders and selectively through a character matrix switch to character inputs of the AND-gates. An AND-gate-corresponding to a code assigned to a string that is the longest match to the plurality of fetched characters is thereby enabled. Update extended strings are recorded in the AND-gates, an extended string comprising a longest matching string extended by the data character following the longest matching string. A virtual level is assigned to an AND-gate indicative of the number of characters of the string recorded thereby, the virtual level being one greater than the level that had been assigned to the AND-gate corresponding to the longest match. The virtual level is also indicative of the stage of the input character buffer holding the character following the longest match. An AND-gate is reassigned to an extended string to be recorded when further codes are unavailable for assignment and the output of the AND-gate is not coupled to the prefix code input of another AND-gate.

34 Claims, 9 Drawing Sheets

Single Character String Processing

Multiple Character String Processing

US 6,788,226 B1

DATA COMPRESSOR WITH STRING CODE REASSIGNMENT UTILIZING SWITCHED INPUT COINCIDENCE ELEMENTS

CROSS REFERENCE TO RELATED APPLICATIONS

U.S. patent application Ser. No. 10/195,795 "Matrix Implemented Data Compression Apparatus and Method" by Cooper, filed Jul. 15, 2002, discloses a matrix implementation for LZ type compressors.

U.S. patent application Ser. No. 10/271,196 "Data Compression Apparatus and Method Utilizing Tandem Coupled Matrices" by Cooper, filed Oct. 15, 2002, discloses a tandem coupled matrix implementation for LZ type compressors.

U.S. patent application Ser. No. 10/313,192 "Prefix Table Implemented Data Compression Method And Apparatus Utilizing String Code Reassignment" by Cooper, filed Dec. 7, 2002 discloses a compressor implemented utilizing prefix tables with string codes reassigned to newly encountered strings.

U.S. patent application Ser. No. 10/351,210 "Data Compressor Utilizing Switched Input Coincidence Elements" by Cooper, filed Jan. 25, 2003, discloses a matrix implementation for LZ type compressors utilizing switched input coincidence elements.

U.S. patent application Ser. No. 10/448,620 "Data Compressor Utilizing Switched Input Coincidence Elements Arranged In Virtual Levels" by Cooper, filed May 30, 2003, discloses a compressor similar to that of said Ser. No. 10/351,210 with virtual levels assigned to the coincidence elements.

Said Ser. No. 10/195,795; Ser. No. 10/271,196; Ser. No. 10/313,192; Ser. No. 10/351,210 and Ser. No. 10/448,620 are incorporated herein by reference.

BACKGROUND OF THE INVENTION

1. Field of the Invention

The invention relates to LZ data compression systems particularly with respect to the LZW compression methodology. More particularly, the invention relates to a string deletion process for recovering string codes in a coincidence element matrix implemented compressor such as that described in said Ser. No. 10/448,620.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, 31 Jul., 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, G neva 1990. The V.42 bis standard is further described in an article entitled "V.42 bis: Th New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; U.S. Pat. No. 6,188,333 by Cooper, issued Feb. 13, 2001; and U.S. Pat. No. 6,320,523 by York et al., issued Nov. 20, 2001.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as associative memory dictionaries, hashing and sibling lists as are well understood in the art.

In the above dictionary based systems, numerous iterative operations and dictionary accesses are required at the compressor for compressing an input stream of data characters. Normally an iteration including several dictionary accesses is required for each input data character and when utilizing an associative memory, it may be necessary to search the entire memory to determine if a string exists therein.

The data compressor of said Ser. No. 10/448,620 provides an improvement over the prior art by replacing the known dictionary architectures by a matrix of coincidence elements eliminating both dictionary accesses and compressor iterations. It is desirable in such a system to include a string deletion algorithm to recover string codes so as to enhance system performance.

In the prior art dictionary based LZ compression systems, data character strings are deleted utilizing procedures such as those described in said U.S. Pat. Nos. 4,814,746; 4,876,541; 5,153,591 as well as in said CCITT V.42 bis standard. A string deletion implementation for use with a compressor of the typ disclosed in said Ser. No. 10/448,620 does not yet exist in the prior art.

SUMMARY OF THE INVENTION

The present invention provides a novel string deletion implementation particularly suited to the coincidence element matrix architecture of said Ser. No. 10/448,620.

The present invention is embodied in a data compressor for compressing an input stream of data characters into an output stream of compressed codes. The compressor includes a plurality of coincidence elements corresponding to a respective plurality of codes to be assigned to strings. A string is comprised of a prefix string of at least one of the data characters followed by an extension character, a prefix string having a prefix code associated therewith. A coincidence element provides a coincidence output and has a prefix code input and a character input for enabling the coincidence element to energize the coincidence output thereof upon coincidental energization of the inputs so that energization of a coincidence output of a coincidence element provides a representation of the code corresponding thereto. The compressor further includes a first coupling arrangement for selectively coupling the provided representations of codes corresponding to the coincidence elements to the prefix code inputs of the coincidence elements and a second coupling arrangement for selectively coupling representations of data characters fetched from the input stream to the character inputs of the coincidence elements. Extended strings are recorded in the coincidence elements where an extended string comprises a longest matching string extended by the data character following the longest matching string. When further codes are unavailable for assignment to extended strings to be recorded, a coincidence element is selected for reassignment. A coincidence element is selected if the coincidence output ther of is not coupled to the prefix code input of another coincidence element. The coincidence element is tested by applying enable signals to the prefix code and character inputs thereof and enable signals selectively to the character inputs of further coincidence elements. If only the tested coincidence element is enabled, it is selected for reassignment.

DESCRIPTION OF THE PREFERRED EMBODIMENTS

Figure 1:
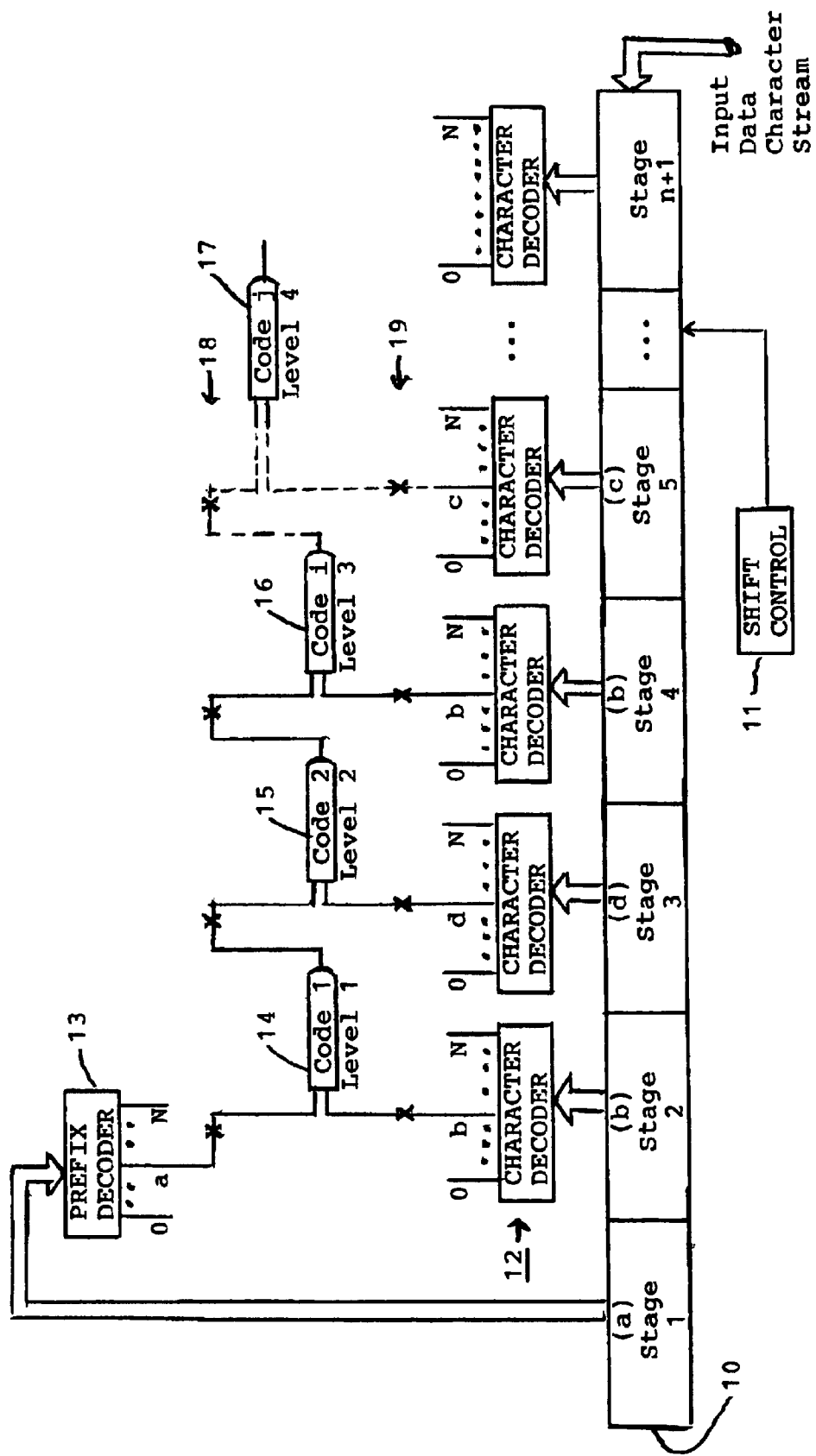
FIG. 1 is a schematic block diagram exemplifying principles of a data compressor in which the present invention is embodied.

Referring to FIG. 1, a schematic block diagram is provided exemplifying principles of the data compressor embodying the present invention. An input data character stream is shifted into an input character buffer 10 by a shift control 11. The buffer 10 is illustrated holding the consecutive characters "abdbc" (in parentheses) from the input stream in stages 1 through 5, respectively. Character decoders 12 coupled to respective buffer stages 2 through n+1 provide unique representations of the respective character values held in the buffer stages. A prefix decoder 13 coupled to buffer stage 1 provides a unique representation of the character value held in stage 1. It is appreciated that prefix decoder 13 is identical to each of the character decoders 12.

Two-input AND-gates 14 through 17 correspond to respective assignable string codes and are assigned virtual levels as illustrated. The AND-gates receive prefix code representations at the prefix code inputs thereof through switches 18 and character representations at the character inputs thereof through switches 19. For example, AND-gate 15 receives the prefix code representation from the output of AND-gate 14 and AND-gate 14 receives the prefix code representation from the prefix decoder 13. It is appreciated that the outputs of the prefix decoder 13 provide single character prefix code representations of the character values held in stage 1 of buffer 10. The switch connections in solid line have previously been established and the switch connections in dashed line will be established.

Strings previously encountered in the input data character stream are recorded in AND-gates 14–16. As illustrated, AND-gate 14 is storing the two-character string "ab" represented by string code 1; AND-gate 15 is storing the three-character string "abd" represented by string code 2 and AND-gate 16 is storing the four-character string "abdb" represented by string code i.

When the illustrated characters are shifted into the buffer 10, the AND-gates 14–16 are enabled substantially instantaneously, thereby instantaneously determining that the string residing in buffer stages 1–4 is the longest match to a previously recorded string. The code of the longest match is the code corresponding to the enabled AND-gate with the largest assigned level. As illustrated, the code of the longest matching string is code i and the character "c" in stage 5 is the mismatching character.

An update extended string is recorded by closing the dashed line switch connections to AND-gate 17 corresponding to a next available string code. The recorded update extended string comprises the longest matching string previously recorded by AND-gate 16 extended by the mismatching character. A virtual level is assigned to AND-gate 17 that is one greater than the level assigned to AND-gate 16. As illustrated, the update extended string recorded by AND-gate 17 is "abdbc".

After outputting the code of the longest matching string and recording the update extended string, the input character buffer 10 is shifted so that the mismatching character resides in stage 1 while new characters are entered from the input data character stream. The number of shifts is one plus the virtual level of the AND-gate of the longest matching string. In the preferred embodiments, the assigned virtual levels are from level 1 to level n in consonance with the n+1 stages of the input character buffer 10. The characters in the buffer 10 comprise a string under test with respect to which a longest match determination is effected.

When a next assignable string code and a corresponding AND-gate is not available at which to record an update string, an appropriate AND-gate is reassigned in accordance with the invention in a manner to be described.

The data compressor embodiments described below are predicated, generally, on the LZW methodology. The embodiments are implemented in a manner similar to that described above where the single character strings are considered as recognized by the compressor although not explicitly included therein. The embodiments are based on said Ser. No. 10/448,620 which is incorporated herein by reference. Details, however, are provided herein for completeness.

Figure 2:
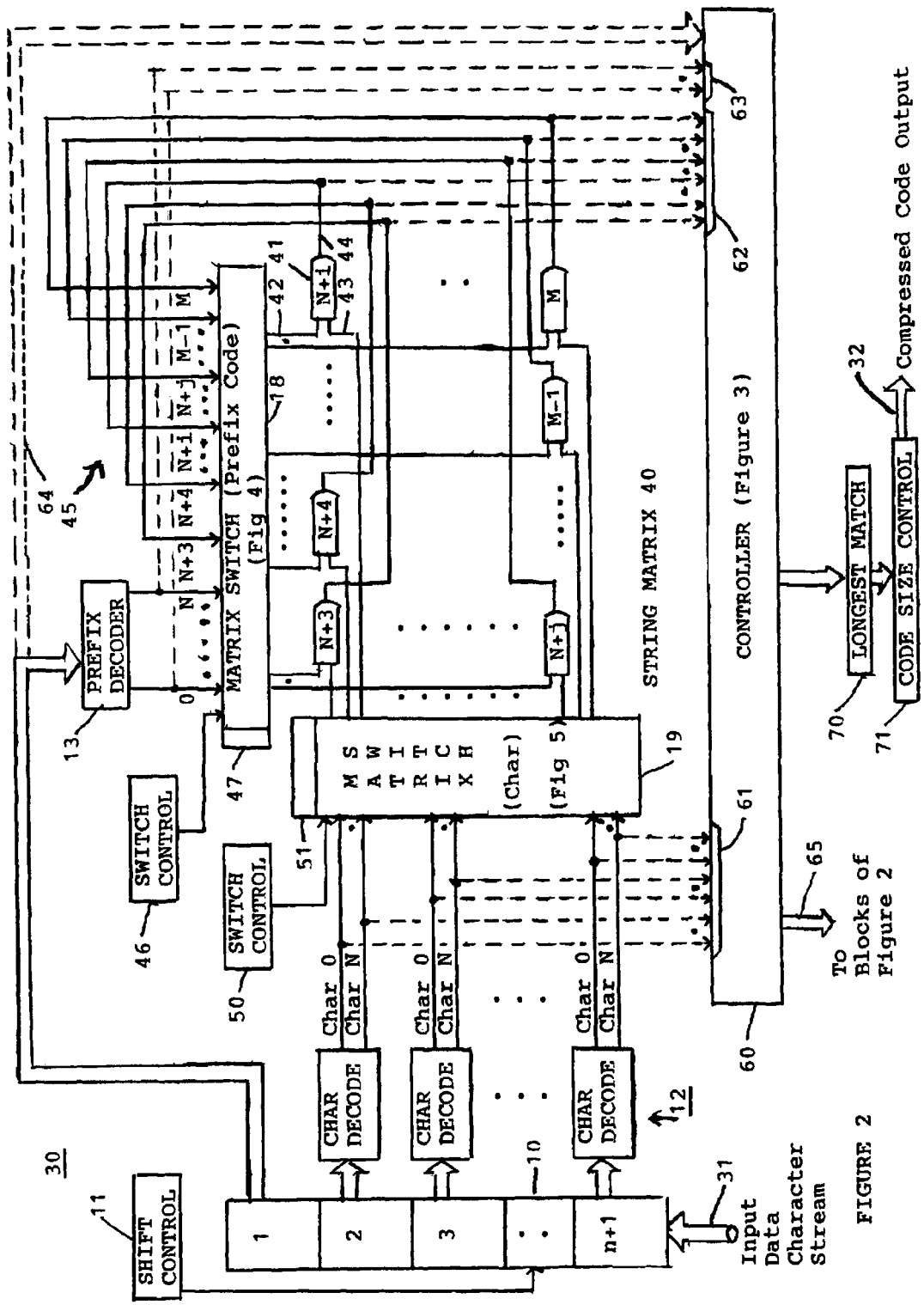
FIG. 2 is a schematic block diagram of a data compressor embodying the present invention.

Referring to FIG. 2, where like reference numerals indicate like components with respect to FIG. 1, a data compressor 30 is illustrated that compresses a stream of input data characters applied at an input 31 into a stream of corresponding compressed codes at an output 32. Input character buffer 10 is included for holding n+1 consecutive characters from the input 31. Accordingly, the stages of the buffer 10 are denoted as 1 to n+1. By operations to be further described, the compressor 30 determines the longest match of the n+1 characters in the buffer 10 with previously encountered strings recorded in the compressor 30. The shift control circuit 11 controls shifting of the buffer 10 so that new input characters are fetched into the n+1 stage while processed characters are discarded from the first stage.

The stages 2 through n+1 of the input character buffer 10 are coupled to the respective character decoders 12. A character decoder 12 energizes a unique output thereof in accordance with the character held in the input character buffer stage to which the decoder is coupled. The energized output of a character decoder 12 thus provides a representation of the character held in the corresponding stage of the input character buffer 10. When the alphabet over which compression is being performed comprises character values 0–N, the outputs of each character decoder 12 are accordingly denoted as char 0–char N, respectively.

The prefix decoder 13, identical to each of the character decoders 12, is coupled to the first stage of the input character buffer 10 and energizes a unique output in accordance with the character held in the first buffer stage. The prefix decoder 13 provides prefix code representations for single character prefix strings and the prefix decoder outputs are, accordingly, denoted as prefix codes 0 through N. One of the prefix decoder outputs 0 through N is uniquely energized for a single character prefix value held in stage 1 of the buffer 10, thus providing a representation of the single character prefix code.

A string of data characters is comprised of a prefix string of one or more characters followed by an extension character, where the prefix string has a prefix code associated therewith. Single character prefix strings conveniently utilize the character values as the prefix codes. In a manner to be further described, a string is represented in the compressor 30 and has a string code assigned thereto. A string code of N+3 is the first available string code assigned by the compressor 30 and a string code of M is the maximum assignable string code. The codes N+1 and N+2 may be utilized as control codes as is well known.

Typically, LZW data compressors are limited to 4096 string codes. When this limitation is applied to the present embodiments and when in the ASCII environment, the alphabet has an 8 bit character size supporting an alphabet of 256 characters having character values of 0–255. The first available multiple character string code may be 258 with the codes 256 and 257 utilized as control cod s. In this example, the maximum assignable string code M is 4095.

The compressor 30 further includes a string matrix 40 comprised of a plurality of coincidence elements such as coincidence element 41. In the preferred embodiments of the invention, the coincidence elements 41 are implemented by AND-gates. The AND-gates of the string matrix 40 correspond, respectively, to the assignable string codes N+3 through M as indicated by the legends. In a manner to be further described, an extended string encountered in the input is recorded by an AND-gate and assigned the string code corresponding thereto.

Each AND-gate, such as AND-gate 41, has an input 42 adapted to receive a prefix code representation and an input 43 adapted to receive a character representation. Each AND-gate, such as AND-gate 41, provides a coincidence output 44 that is energized upon coincidental energization of the inputs 42 and 43. Energization of the coincidence output 44 provides a representation of the code corresponding to the AND-gate.

An extended string recorded by an AND-gate has a prefix string with prefix code corresponding to the prefix code representation applied to the input 42 and an extension character corresponding to the character representation applied to the input 43. The code corresponding to the AND-gate is thus assigned to the string recorded thereby. A representation of the string code assigned to the string is provided by energization of the coincidence output 44 of the AND-gate. It is appreciated that the string code of a particular string becomes the code of the prefix of an extended string having the particular string as its prefix. The coincidence outputs of the AND-gates N+3 through M, conveying the prefix code representations, are applied to respective leads 45 which are denoted as prefix code representation outputs N+3 through M.

Thus, the outputs of the prefix decoder 13 and the prefix code representation outputs of the leads 45 are denoted as prefix code outputs 0 through M with intermediate values N, N+3, N+4, N+i, N+j and M−1 as illustrated. The codes N+1 and N+2 may be utilized as control codes and are therefore not illustrated as prefix code outputs. Using the above example of the ASCII environment with a maximum of 4096 codes, N will be 255 and M will be 4095. The first available code N+3 for assignment to a multiple character string will be 258 and the control codes may be 256 and 257.

The compressor 30 further includes matrix switch 18 with a plurality of inputs and a plurality of outputs. The plurality of inputs of the matrix switch 18 are coupled to the respective prefix code outputs 0 through M of the prefix decoder 13 and the leads 45. The plurality of outputs of the matrix switch 18 are coupled to the respective prefix code inputs of the AND-gates N+3 through M of the string matrix 40. A switch control 46, coupled to the matrix switch 18, controls the matrix switch to selectively couple any one of the matrix switch inputs to one or more of the matrix switch outputs. In this manner, the prefix code outputs of the prefix decoder 13 and the leads 45 are selectively coupled to the prefix code inputs of the AND-gates of the string matrix 40. It is appreciated that a particular matrix switch input can be coupled to the prefix code inputs of more than one of the AND-gates. A code reassignment block 47 is illustrated that controllably applies an enable signal to one of the outputs of matrix switch 18 in performing string code reassignment in a manner to be described. Further details of the matrix switch 18 and interconnection with the code reassignment block 47 will be described with respect to FIG. 4.

The compressor 30 further includes matrix switch 19 with a plurality of inputs and a plurality of outputs. The plurality of inputs of the matrix switch 19 are coupled to respective outputs of the character decoders 12. The plurality of outputs of the matrix switch 19 are coupled to respective character inputs of the AND-gates of the string matrix 40. A switch control 50, coupled to the matrix switch 19, controls the matrix switch to selectively couple any one of the matrix switch inputs to one or more of the matrix switch outputs. In this manner, the char 0 through char N outputs of the respective character decoders 12 are selectively coupled to the character inputs of the AND-gates of the string matrix 40. It is appreciated that a particular output of any of the character decoders 12 can be coupled to the character inputs of more than one AND-gate. A code reassignment block 51 is Illustrated that controllably applies enable signals to the outputs of matrix switch 19 in performing string code reassignment in a manner to be described. Further details of the matrix switch 19 and the interconnection with the code reassignment block 51 will be described with respect to FIG. 5.

It is appreciated from the above with respect to FIGS. 1 and 2 that the AND-gates 14–17 of FIG. 1 are in the string matrix 40 of FIG. 2, the switches denoted as 18 in FIG. 1 are in the matrix switch 18 of FIG. 2 and the switches denoted as 19 in FIG. 1 are in the matrix switch 19 of FIG. 2.

The compressor 30 includes a controller 60 responsive to control inputs represented as dashed lines. The controller 60 receives control inputs 61 from the char 0 through char N outputs of each of the character decoders 12, control inputs 62 from the coincidence outputs of the AND-gates N+3 through M and control inputs 63 from the prefix code outputs 0 through N of the prefix decoder 13. The character value from the first stage of the input character buffer 10 is also provided to the controller 60 via control input 64. The controller 60 provides control signals to the blocks of FIG. 2 via a bus 65 to control the operations of the compressor 10 in a manner to be described. Further details of the controller 60 are illustrated in FIG. 3.

During each longest match compression cycle, the controller 60 provides the code of a longest matching string to a longest match register 70. The code of the longest matching string is provided to the compressor output 32 through a code size control circuit 71 that is utilized, in a well known manner, to control the number of bits utilized for transmitting the compressed code from the output 32. In an ASCII variable length code implementation, the code size may begin with 9 bits and sequentially increase to 10, 11 and 12 bits at codes 512, 1024 and 2048, respectively. It is appreciated that a fixed code size may also be utilized to implement the embodiments.

Figure 3:
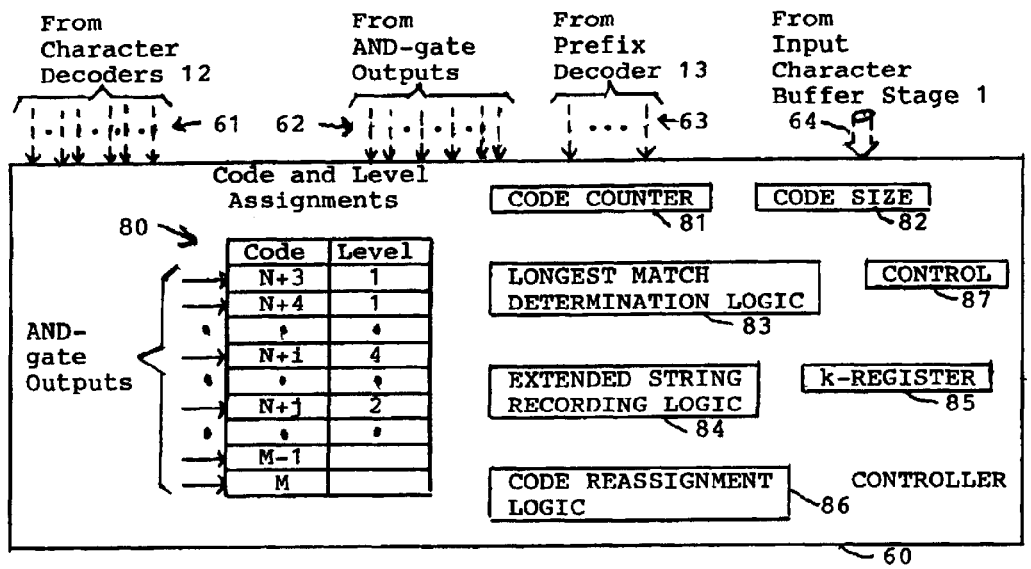
FIG. 3 is a schematic block diagram illustrating details of the controller component of FIG. 2.

Referring to FIG. 3 with continued reference to FIG. 2, where like reference numbers indicate like elements with respect to FIG. 2, details of the controller 60 are illustrated.

The controller 60 includes a code and level assignment table 80 for storing the respective string codes assigned to the AND-gates of the string matrix 40 together with the virtual levels assigned thereto. As illustrated, the code and level assignment table 80 is storing the codes N+3 through M corresponding to the similarly denoted AND-gates together with assigned virtual levels. The coincidence outputs of the AND-gates are coupled via the leads 62 to access the respective locations of the code and level assignment table 80 to provide the code and level stored at an accessed location. The code and level assignment table 80 may be initialized with all of the assignable string codes N+3 through M. Alternatively, the string codes may be stored in the locations of the table when required to be assigned to a string to be recorded at an AND-gate.

The controller 60 includes a code counter 81 for registering the next code to be assigned to a string. The code counter 81 indicates the code corresponding to the next available AND-gate for recording an extended string to be stored. The code counter 81 is initialized to the first available code N+3 and is incremented for each recorded string until the maximum assignable code M is exceeded. Any convenient mechanism such as counter overflow can be utilized to detect that the code counter 81 has exceeded the maximum assignable code. When this occurs the code counter 81 is reset to the first available string code and string code reassignment in accordance with the invention is utilized as will be described with respect to FIGS. 4, 5, 9 and 10.

The controller 60 further includes a code size register 82 for determining the number of bits utilized by the code size control 71 for transmitting the compressed codes on the output 32. When the code in the code counter 81 first cycles from N+3 to M, the code size in the code size register 82 is set in accordance with the count in the code counter. The code size is set to an initial value and incremented at predetermined codes of the code counter 81 until a maximum code size is attained. In the ASCII example discussed above, the code size may begin with 9 bits and sequentially increase to 10, 11 and 12 bits at codes 512, 1024 and 2048, respectively. After string code reassignment has been activated the code size is maintained at maximum.

The controller 60 further includes longest match determination logic 83 and extended string recording logic 84. The logic 83 determines the longest match of the input data character stream held in the input character buffer 10 with a string recorded by an AND-gate of the string matrix 40. The logic 84 records an extended string encountered in the input at a next available AND-gate of the string matrix 40. A k-register 85 utilized by the logic 83 and 84 is included for holding a working parameter "k". During a longest match determination, the parameter k is set equal to the largest assigned level of the enabled AND-gates. The controller 60 further includes code reassignment logic 86 for reassigning string codes and corresponding AND-gates to new strings to be recorded when the available string codes have already been assigned.

The controller 60 also includes control circuit 87 for controlling the detailed operations to be executed by the compressor 30 in accordance with the flow chart diagrams of FIGS. 6–10 to be described. The control circuit 87 is considered as containing appropriate circuitry, such as state machines, or appropriate software to control execution of the operations.

Figure 4:
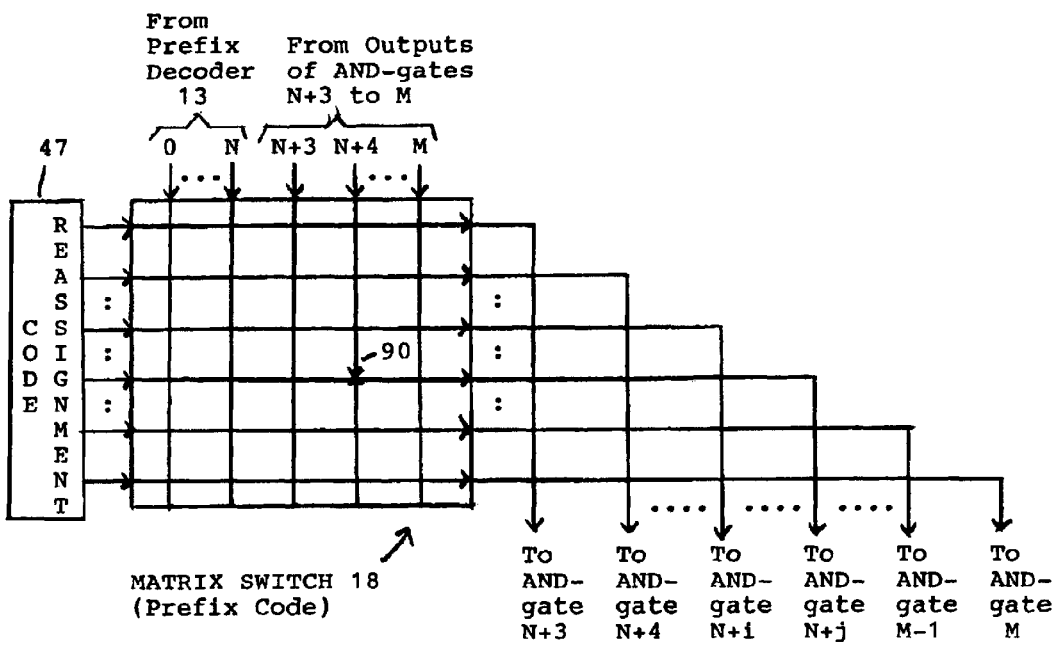
FIG. 4 is a schematic block diagram illustrating details of the prefix code matrix switch component of FIG. 2.

Referring to FIG. 4, where like reference numerals indicate like components with respect to FIG. 2 and with continued reference to FIG. 2, further details of the matrix switch 18 and interconnection of the code reassignment block 47 therewith are illustrated. The matrix switch 18 is comprised of columns coupled to the matrix switch inputs and rows coupled to the matrix switch outputs. The columns of the matrix switch receive inputs from the prefix code representation outputs of the prefix decoder 13 and the outputs of AND-gates N+3 to M and the matrix switch rows provide outputs to the prefix code inputs of the AND-gates N+3 to M. Each column and row intersection is a controllable switch connection, such as switch connection 90, actuated by the switch control 46. The switch control 46 is operative for selectively coupling any one of the matrix switch 18 inputs to one or more of the matrix switch outputs. For example, the switch connection 90 connects the prefix code representation output of the AND-gate N+4 to the prefix code input of the AND-gate N+j.

Figure 9:
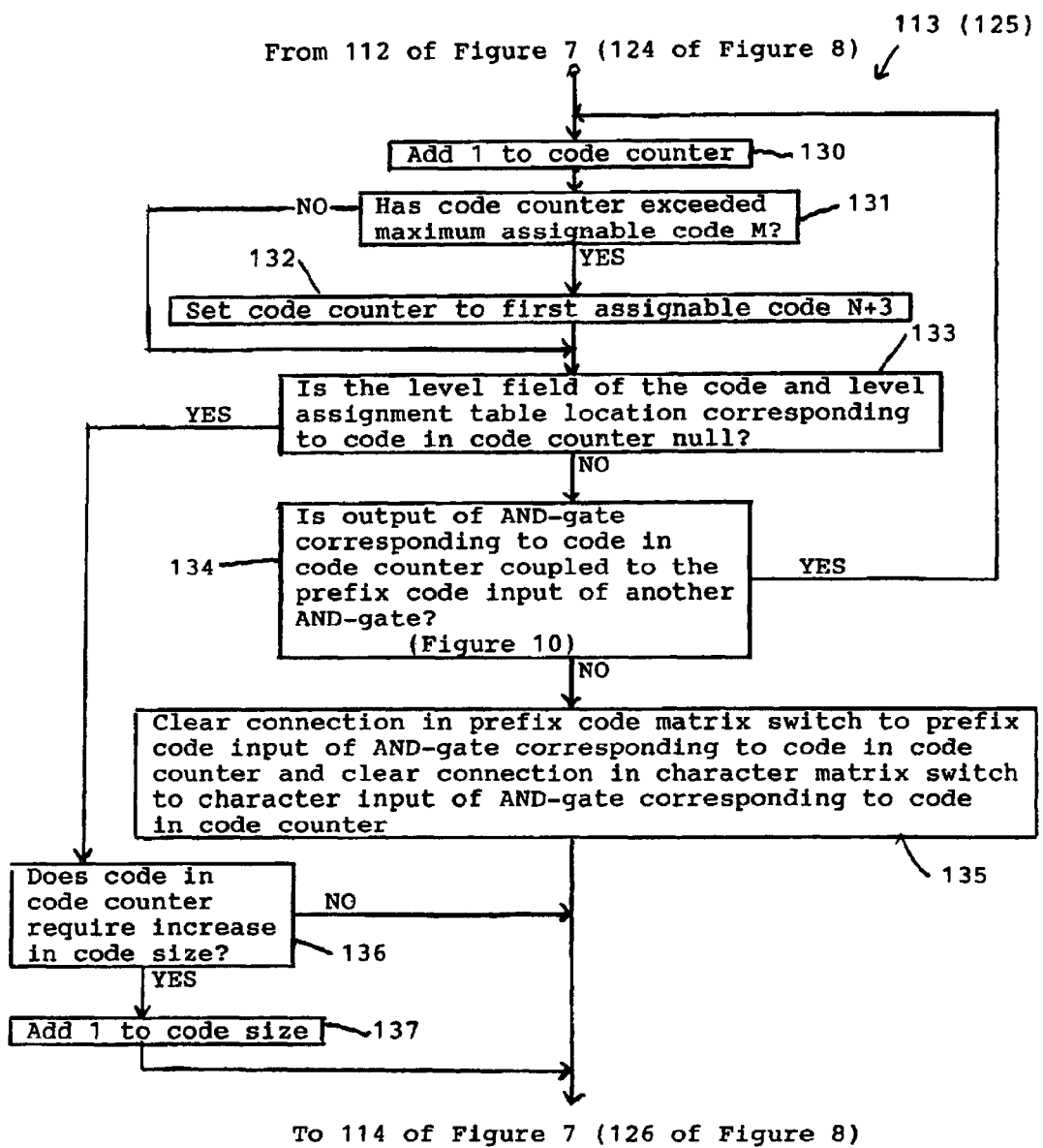
FIG. 9 is a control flow chart illustrating details of the advance code counter processing of FIGS. 7 and 8.
Figure 10:
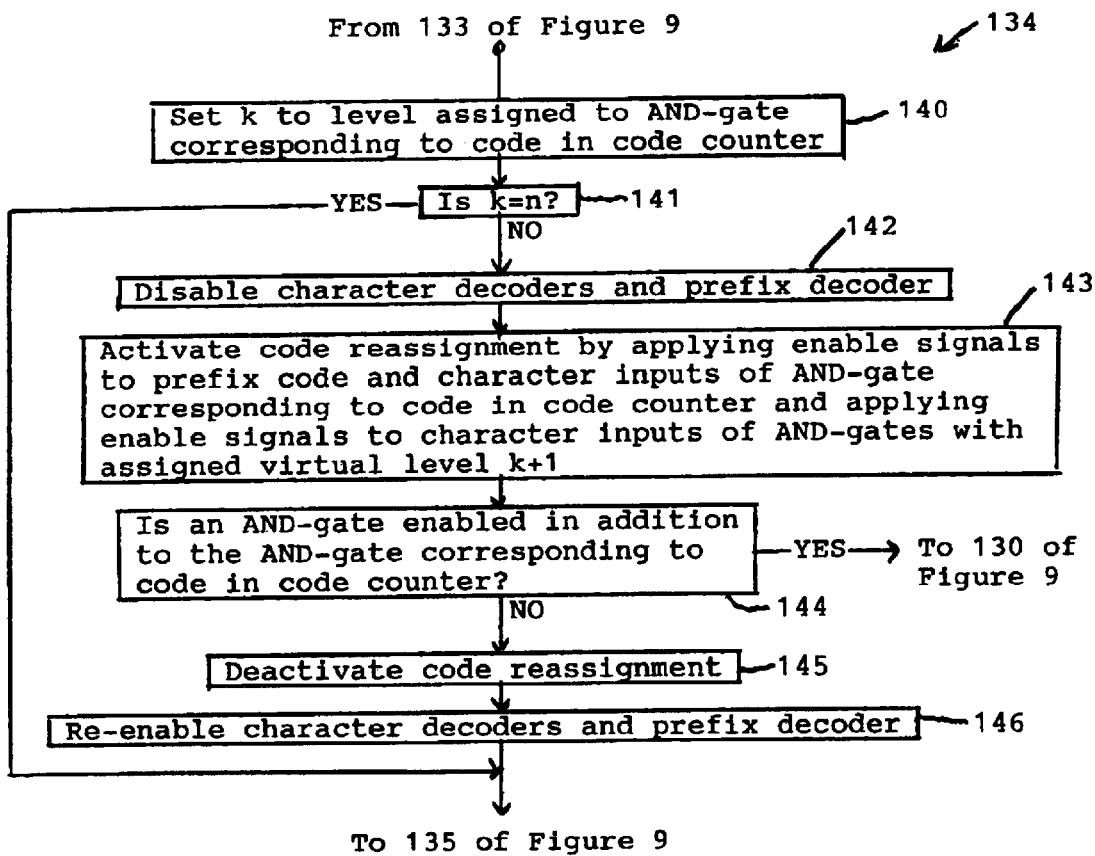
FIG. 10 is a control flow chart illustrating details of the AND-gate selection test of FIG. 9.

The code reassignment block 47 is coupled to the matrix switch rows so as to apply an enable signal to the prefix code input of a selected one of the AND-gates N+3 to M during the code reassignment process to be described with respect to FIGS. 9 and 10.

Figure 5:
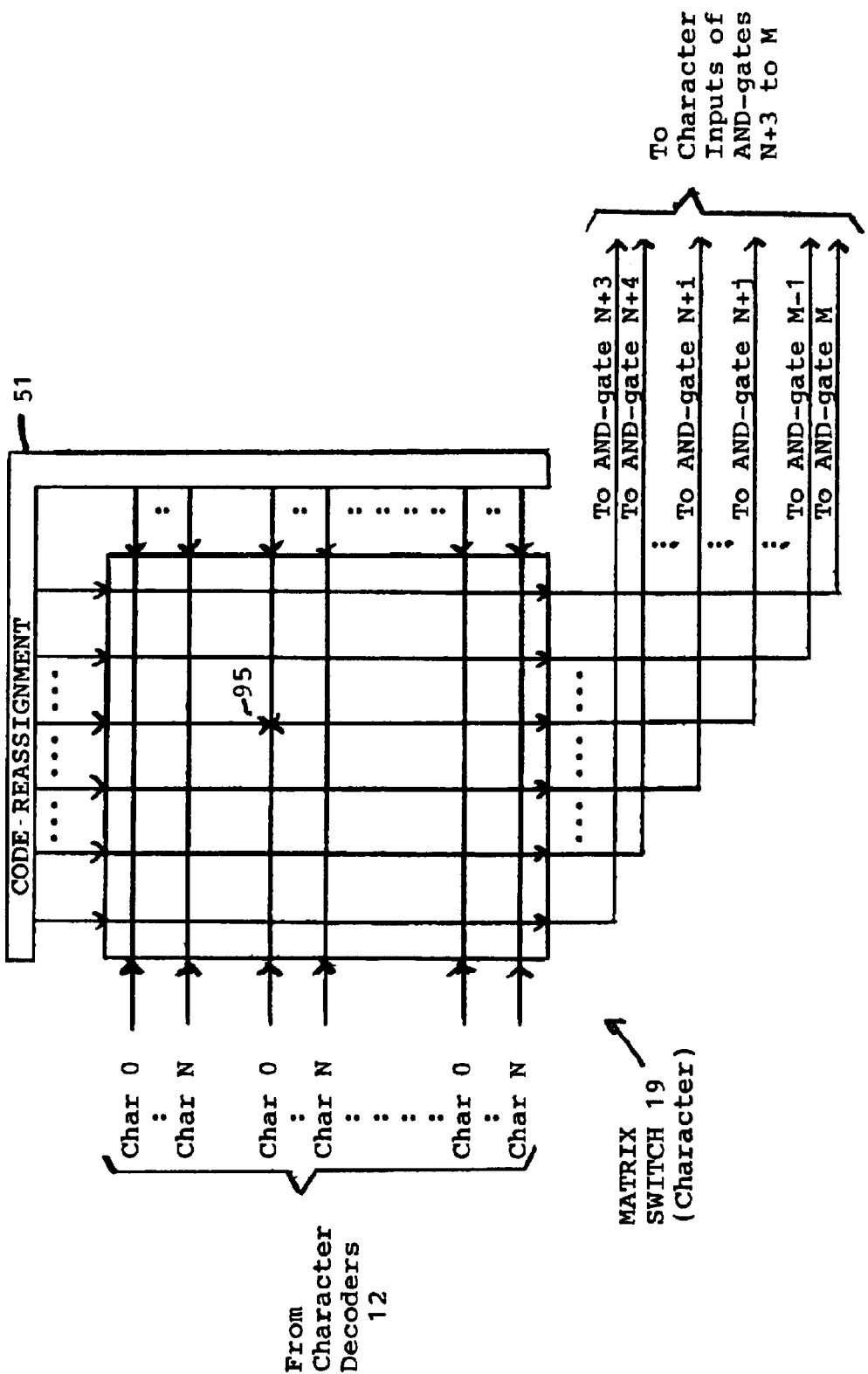
FIG. 5 is a schematic block diagram illustrating details of the character matrix switch component of FIG. 2.

Referring to FIG. 5, where like reference numerals indicate like components with respect to FIG. 2 and with continued reference to FIG. 2, further details of the matrix switch 19 and the interconnection of the code reassignment block 51 therewith are illustrated. The matrix switch 19 is comprised of rows coupled to the matrix switch inputs and columns coupled to the matrix switch outputs. The matrix switch rows receive inputs from the character representation outputs of the character decoders 12 and the matrix switch columns provide outputs to the character inputs of the AND-gates N+3 to M. Each row and column intersection is a controllable switch connection, such as the switch connection 95, actuated by the switch control 50. The switch control 50 is operative for selectively coupling any one of the matrix switch inputs to one or more of the matrix switch outputs. For example, the char 0 output from the character decoder 12 that is coupled to stage 3 of the input character buffer 10 is coupled through the switch connection 95 to the character input of AND-gate N+j.

The code reassignment block 51 is coupled to the matrix switch columns (and optionally the rows) so as to apply enable signals selectively to the character inputs of the AND-gates N+3 to M during the code reassignment process to be described with respect to FIGS. 9 and 10.

With continued reference to FIGS. 2–5, it is appreciated that with the switch connections 90 and 95 illustrated in FIGS. 4 and 5, the AND-gate N+j is recording the extended string having a prefix string with code N+4 and an extension character of char 0.

Briefly, the operation of the compressor 30 is as follows. With n+1 characters fetched from the input stream into the input character buffer 10, the compressor 30 determines the code of the longest string in the buffer 10 that matches a previously encountered string recorded in the string matrix 40 where the first character of string in the buffer 10 resides in buffer stage 1.

If the two-character string in buffer stages 1 and 2 had not previously been encountered therein, the longest match is the single character string comprising the character in buffer stage 1. The controller 60 detects this condition by examining the AND-gate outputs 62 determining that none of the AND-gates are enabled. The character value from buffer stage 1, applied to the controller 60 via bus 64, is transferred to the longest match register 70 as the code of the longest matching string.

An appropriate update string is recorded in a next available AND-gate corresponding to the string code in code counter 81. Accordingly, switch connections are established by the switch control 46 and the switch control 50 in the respective matrix switches 18 and 19 coupling the prefix code input of the AND-gate corresponding to the string code in code counter 81 to the energized output of the prefix decoder 13 and coupling the character input of the AND-gate to the energized output of the character decoder coupled to stage 2 of the input character buffer 10.

The AND-gate corresponding to the string code in code counter 81 is assigned virtual level 1 by storing the level 1 indication in the code and level assignment table 80 at the location corresponding to the code in code counter 81. The code counter 81 is controlled to provide a next available string code and the input character buffer 10 is shifted one time by shift control 11 entering one new character from the input.

If the longest matching string in the input character buffer 10 is a multiple character string, the controller 60 detects this condition by examining the AND-gate outputs 62 determining that at least one AND-gate is enabled. The code of the longest matching string is the code assigned to the enabled AND-gate with the largest level and the code is transferred to the longest match register 70. For convenience, a working parameter k is set in the k-register 85 to the level assigned to the enabled AND-gate with the largest level.

An appropriate update string is recorded in a next available AND-gate corresponding to the string code in code counter 81. Accordingly, switch connections are established by the switch control 46 and the switch control 50 in the respective matrix switches 18 and 19 coupling the prefix code input of the AND-gate corresponding to the string code in code counter 81 to the output of the enabled level k AND-gate and coupling the character input of the AND-gate corresponding to the string code in code counter 81 to the energized output of the character decoder coupled to stage k+2 of the input character buffer 10.

The AND-gate corresponding to the string code in code counter 81 is assigned virtual level k+1 by storing the level k+1 indication in the code and level assignment table 80 at the location corresponding to the code in code counter 81. The code counter 81 is controlled to provide a next available string code and the input character buffer 10 is shifted k+1 times by shift control 11 entering k+1 new characters from the input.

After the code counter 81 has executed a first cycle through all available string codes, a code and corresponding AND-gate is reassigned if the AND-gate output is not coupled to the prefix code input of another AND-gate.

Figure 6:
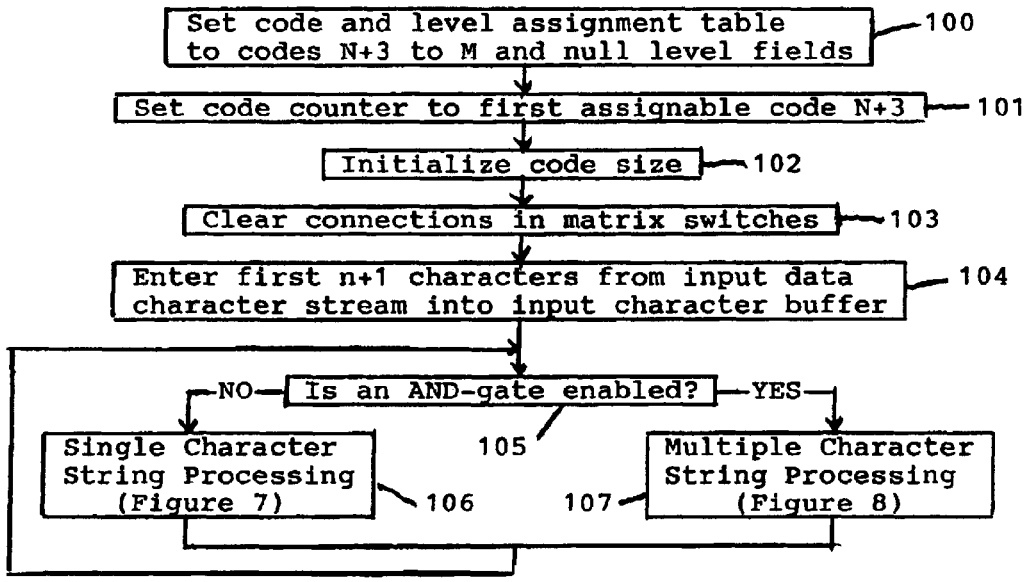
FIG. 6 is a control flow chart illustrating operations executed by the compressor of FIG. 2 in performing data compression utilizing the string code reassignment of the present invention.

Referring to FIG. 6, with continued reference to FIGS. 2–5, a control flow chart is illustrated showing the flow of operations to be executed by the compressor 30. The control 87 in the controller 60 is considered as containing appropriate circuitry, such as state machines, to control execution of the operations.

At a block 100, the code fields of the locations of the code and level assignment table 80 are set to respective codes N+3 to M and the level fields are nulled. At a block 101, the code counter 81 is set to the first assignable code N+3. At a block 102, the code size register 82 is initialized to the beginning code size, for example, 9 bits in ASCII embodiments. At a block 103, utilizing the switch controls 46 and 50, all of the connections in the matrix switches 18 and 19 are opened. At a block 104, utilizing the shift control 11, the first n+1 characters from the input 31 are shifted into the input character buffer 10.

At a block 105, the longest match determination logic 83 in the controller 60 tests the control inputs 62 to determine if an AND-gate output is energized. If at the block 105 an AND-gate is not enabled, the NO branch is taken from the block 105 to a block 106 to perform single character string processing. Details of the processing of block 106 are described below with respect to FIG. 7. If at the block 105 at least one AND-gate is enabled, the YES branch is taken from the block 105 to a block 107 to perform multiple character string processing. Details of the processing of block 107 are described below with respect to FIG. 8.

In each of the blocks 106 and 107 a longest match code is output, an update string is recorded in the string matrix 40, the code counter 81 is advanced to a string code to be assigned to a next update string and the input character buffer 10 is replenished with new data to be tested. The blocks 106 and 107 return to the block 105 to begin the next longest match cycle of the compressor 30.

Figure 7:
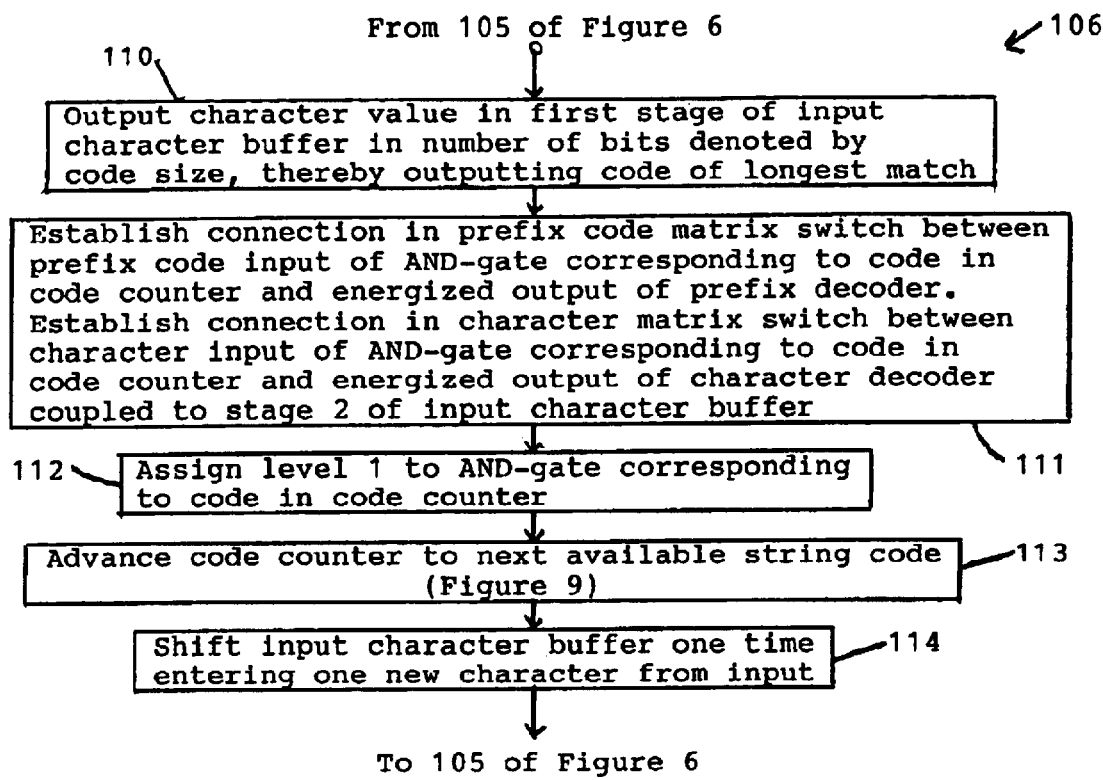
FIG. 7 is a control flow chart illustrating details of the single character string processing of FIG. 6.

Referring to FIG. 7, with continued reference to FIGS. 2–6, details of the single character string processing of block 106 of FIG. 6 are illustrated. Control enters a block 110 from the NO branch of block 105. At the block 110 the character value in the first stage of the input character buffer 10 is output thereby outputting the code of the longest match. The character value is output in the number of bits controlled by the code size register 82 and is transferred by the controller 60 from the bus 64 to the longest match register 70 to provide the compressed code output at the output 32 of the compressor 30.

Control proceeds from the block 110 to a block 111 whereat the extended string recording logic 84 records an appropriate update extended string in an AND-gate of the string matrix 40. Accordingly, the controller 60, via the switch control 46, establishes the connection in the matrix switch 18 between the prefix code input of the AND-gate corresponding to the code in the code counter 81 and the energized output of the prefix decoder 13. The controller 60 also, via the switch control 50, establishes the connection in the matrix switch 19 between the character input of the AND-gate corresponding to the code in the code counter 81 and the energized output of the character decoder 12 coupled to stage 2 of the input character buffer 10.

By the processing of block 111, the next available code is assigned to the two-character extended string whose prefix is the single character string from stage 1 of the input character buffer 10 and whose extension character is resident in stage 2 of the input character buffer 10. This extended string is thereby recorded in the AND-gate corresponding to the next available code.

At a block 112, the virtual level 1 is assigned to the AND-gate corresponding to the code in the code counter 81 by setting the level 1 indication into the level field of the location in the code and level assignment table 80 that corresponds to the code in the code counter 81.

Control proceeds from the block 112 to a block 113 whereat the code counter 81 is advanced to a next available string code. Details of the code counter advancement block 113 are described below with respect to FIG. 9. Processing proceeds from the block 113 to a block 114 whereat the input character buffer 10 is shifted one time entering one new character from the input 31. Control returns from the block 114 to the block 105 of FIG. 6 to process the new character string in the buffer.

Figure 8:
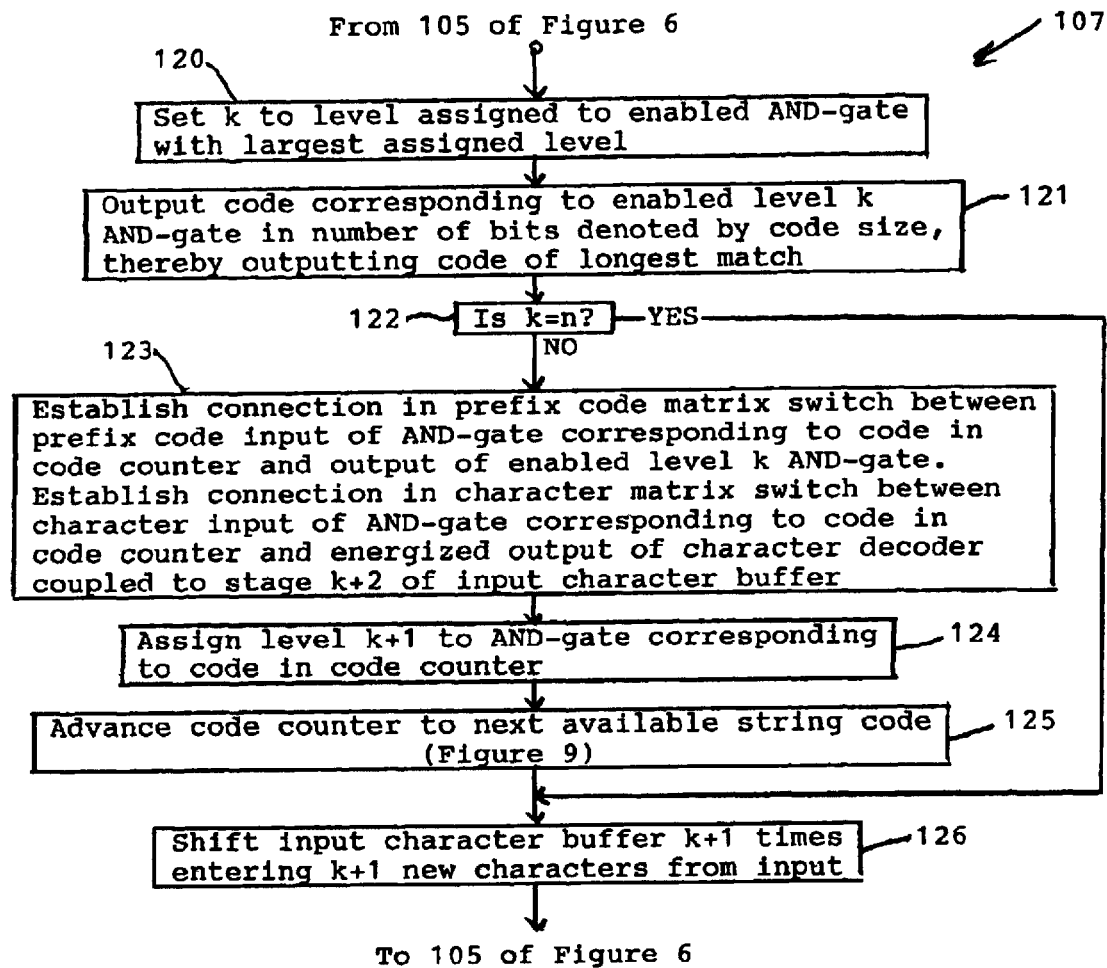
FIG. 8 is a control flow chart illustrating details of the multiple character string processing of FIG. 6.

Referring to FIG. 8, with continued reference to FIGS. 2–6, details of the multiple character string processing of block 107 of FIG. 6 are illustrated. Control enters a block 120 from the YES branch of block 105 of FIG. 6.

At the block 120, the working parameter k in the k-register 85 is set to the level assigned to the enabled AND-gate with the largest assigned level. The processing of block 120 is effected utilizing the control inputs 62 to the controller 60 from the AND-gate outputs and the code and level assignment table 80. The outputs of the enabled AND-gates access the corresponding locations in the table 80 and the parameter k is taken from the level stored in the level field of the accessed location with the highest stored level.

Processing continues with a block 121 whereat the code corresponding to the enabled level k AND-gate is output thereby outputting the code of the longest match. The code is output in the number of bits controlled by the code size register 82 and is transferred by the controller 60 to the longest match register 70 to provide the compressed code output at the output 32 of the compressor 30. The code is provided from the code field of the accessed location of the table 80 with the largest level as determined in block 120. It is appreciated that the longest matched string resides in stages 1 through k+1 of the input character buffer 10.

Control proceeds from the block 121 to a block 122 whereat the parameter k is tested to determine if k is equal to n. If k is not equal to n, the NO branch from the block 122 is taken to a block 123.

At the block 123, the extended string recording logic 84 records an appropriate update extended string in an AND-gate of the string matrix 40. Accordingly, the controller 60, via the switch control 46, establishes the connection in the matrix switch 18 between the prefix code input of the AND-gate corresponding to the code in the code counter 81 and the output of the enabled level k AND-gate. The controller 60 also, via the switch control 50, establishes the connection in the matrix switch 19 between the character input of the AND-gate corresponding to the code in the code counter 81 and the energized output of the character decoder 12 coupled to stage k+2 of the input character buffer 10.

By the processing of block 123, the next available code is assigned to the multiple character extended string whose prefix is represented by the output of the enabled level k AND-gate and whose extension character is resident in stage k+2 of the input character buffer 10. The string prefix is the longest matching string resident in stages 1 through k+1 of the input character buffer 10. This extended string is thereby recorded in the AND-gate corresponding to the next available code.

At a block 124, the virtual level k+1 is assigned to the AND-gate corresponding to the code in the code counter 81 by setting the level k+1 indication into the level field of the location in the code and level assignment table 80 that corresponds to the code in the code counter 81.

Control proceeds from the block 124 to block 125 whereat processing is performed identical to that of the block 113 described above with respect to FIG. 7. Processing proceeds from the block 125 to a block 126 whereat the input character buffer 10 is shifted k+1 times entering k+1 new characters from the input 31. Control returns from the block 126 to the block 105 of FIG. 6 to process the new character string in the buffer.

If, at the block 122, k is equal to n, control proceeds via the YES branch of the block 122 directly to the block 126 bypassing the processing of the blocks 123–125. When this protocol is utilized, an extended string is not recorded and the code counter 81 is not advanced to a next available code and provision should therefore be included at a decompressor to maintain synchronism with the compressor 30.

Referring to FIG. 9, with continued reference to FIGS. 2–8, a control flow chart providing the details of block 113 of FIG. 7 (block 125 of FIG. 8) is illustrated. In the FIG. 9 processing, the code counter 81 is advanced from the initial string code to the maximum string code and the codes from the code counter are assigned to respective strings recorded in the string matrix 40. When the code counter exceeds the maximum string code, the codes are recycled and selectively reassigned to new strings. The code and level assignment table 80 is utilized to determine if a string code is assigned and a previously assigned string code is reused if the string corresponding thereto has not been extended. The processing of FIG. 10 is utilized to effect this determination. If the candidate string code is reassigned, the previous string is deleted by the processing of block 135.

Accordingly, from block 112 of FIG. 7 (block 124 of FIG. 8), control enters a block 130 whereat the code counter 81 is incremented by 1. At a block 131, a test is performed to determine if the code counter 81 has exceeded the maximum string code M. Conveniently, the test may be effected by examining the code counter overflow. If as the result of incrementing the code counter at the block 130, the code counter exceeds the maximum string code at the block 131, the YES branch is taken from the block 131 to a block 132. At the block 132, the code counter 81 is reset to the initial assignable string code N+3. Processing then proceeds to a block 133.

If, at the block 131, the code counter 81 has not exceeded the maximum string code M, the NO branch is taken from the block 131 directly to the block 133 bypassing block 132.

At the block 133, the code and level assignment table 80 is accessed to determine if the level field of the code and level assignment table location corresponding to the code in the code counter 81 is null. If the level field of the accessed table location is null, the string code in the code counter 81 has not yet been assigned to a string and the YES branch from the block 133 is taken through code size adjusting blocks 136 and 137 directly to the block 114 of FIG. 7 (block 126 of FIG. 8) for continued processing. It is appreciated that in a following processing cycle, the code in the code counter 81 is assigned to the next extended string to be recorded in the string matrix 40.

If, at the block 133, the level field of the accessed code and level assignment table location is not null, the code in the code counter 81 is already assigned to a recorded extended string and the NO branch from the block 133 is taken to a block 134. The block 134 processing determines if the string corresponding to the code in the code counter 81 has been further extended. Accordingly, at the block 134, a test is effected to determine if the output of the AND-gate corresponding to the code in the code counter 81 is coupled to the prefix code input of another AND-gate. If the AND-gate output is so coupled, the YES branch from the block 134 is taken back to the block 130 to continue processing with a new string code candidate. If the AND-gate output is not so coupled, the NO branch from the block 134 is taken to a block 135. Details of the processing of the block 134 are described below with respect to FIG. 10.

At the block 135, the extended string recorded in the AND-gate corresponding to the code in the code counter 81 is effectively deleted releasing the AND-gate for the recordation of the next extended string to be stored. Accordingly, at the block 135, the connections to the inputs of the AND-gate corresponding to the code in the code counter 81 are cleared. Specifically, the connection in the prefix code matrix switch 18 and the connection in the character matrix switch 19 to the prefix code input and the character input, respectively, of the AND-gate are cleared.

Control then returns to block 114 of FIG. 7 (block 126 of FIG. 8) for continued processing. It is appreciated that in a following processing cycle, the code in the code counter 81 is reassigned to the next extended string to be recorded in the string matrix 40.

When the YES branch is taken from the block 133, processing proceeds to block 136 whereat the code in the code counter 81 is tested to determine if an increase in code size is required. If so, processing continues to block 137 whereat the code size register 82 is incremented by 1. Control then returns to the block 114 of FIG. 7 (block 126 of FIG. 8) either from the NO branch of block 136 or from block 137 to continue the processing.

It is appreciated that the code reassignment logic 86 of FIG. 3 performs the processing of FIG. 9. It is also appreciated that in the first cycling of the codes in the code counter, the NO branch is taken from the block 131 and the YES branch is taken from the block 133 through the blocks 136 and 137 directly to the block 114 of FIG. 7 (block 126 of FIG. 8). In the subsequent recycling of the codes, the NO branch is always taken from the block 133 for string code reassignment.

Referring to FIG. 10, with continued reference to FIGS. 1–9, details for the processing of block 134 of FIG. 9 are illustrated. Accordingly, control enters a block 140 from the NO branch of block 133 of FIG. 9. At the block 140, the parameter k in the k-register 85 is set to the level assigned to the AND-gate corresponding to the code in the code counter 81. The code in the code counter is utilized in accessing the location in the table 80 corresponding to the code and the parameter k is taken from the level stored in the level field of the accessed location.

Processing continues at a block 141 whereat the parameter k is tested to determine if k is equal to n. If k is not equal to n, the NO branch from the block 141 is taken to a block 142. At the block 142, the character decoders 12 and the prefix decoder 13 of FIG. 2 are disabled so that character and prefix decoder outputs do not interfere with the test of block 144.

Processing continues from the block 142 to a block 143 whereat code reassignment is activated by applying enable signals to the inputs of appropriate AND-gates including the AND-gate corresponding to the code in the code counter. Specifically, the code reassignment block 47 of FIG. 4 is activated to selectively apply an enable signal through the matrix switch 18 to the prefix code input of the AND-gate corresponding to the code in the code counter. The code reassignment block 51 of FIG. 5 is also activated to selectively apply an enable signal through the matrix switch 19 to the character input of the AND-gate corresponding to the code in the code counter.

The code reassignment block 51 is further activated to selectively apply enable signals through the matrix switch 19 to the character inputs of the AND-gates with assigned virtual level k+1. The code and level assignment table 80 can be utilized to identify these AND-gates so that the enable signals are appropriately applied.

Alternatively, the code reassignment block 51 can be utilized to apply enable signals to the matrix switch 19 rows coupled to the outputs of the character decoder 12 that is coupled to stage k+2 of the input character buffer 10. These enable signals are thus applied to the character inputs of the AND-gates of virtual level k+1 from the matrix switch rows to the matrix switch columns through the established matrix switch connections.

Processing continues with block 144 whereat a test is performed to determine if, in response to the enable signals applied at block 143, an AND-gate is enabled in addition to the AND-gate corresponding to the code in the code counter. If so, the YES branch is taken from the block 144 to the block 130 of FIG. 9 to test a next candidate code.

If, at the block 144, only the AND-gate corresponding to the code in the code counter is enabled, the code in the code counter is appropriate for reassignment and the NO branch from the block 144 is taken to blocks 145 and 146. At the block 145 the code reassignment blocks 47 and 51 are deactivated and at the block 146 the character decoders 12 and the prefix decoder 13 are re-enabled. From the block 146 processing continues at the block 135 of FIG. 9.

If, at the block 141, k is equal to n, control proceeds via the YES branch of the block 141 directly to the block 135 of FIG. 9 bypassing the processing of the blocks 142–146. By the operations described with respect to FIG. 8, the output of an AND-gate with virtual level n will not be coupled to the prefix code input of another AND-gate.

It is appreciated that the functions of the blocks 134 and 135 of FIGS. 9 and 10 are performed by the code reassignment logic 86 of FIG. 3 and the switch controls 46 and 50 are utilized in the connection clearing of block 135. Although FIG. 10 describes preferred protocols for implementing the functionality of block 134 of FIG. 9, it is appreciated that other protocols may be utilized to the same effect.

Figure 11:
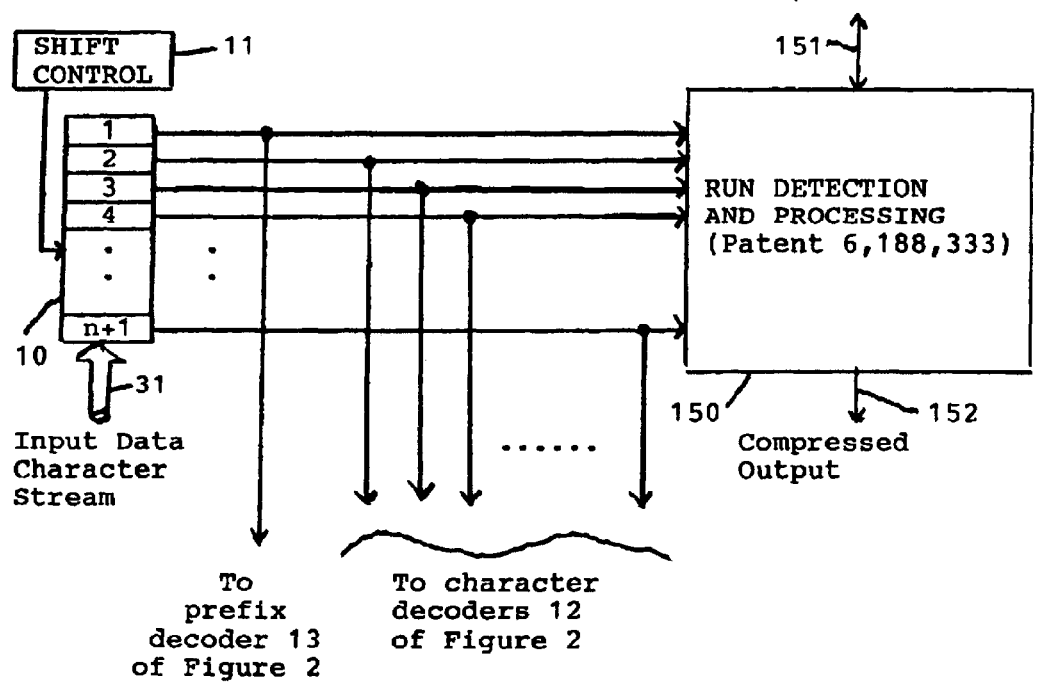
FIG. 11 is a schematic block diagram of an addition to the embodiment of FIG. 2 for providing enhanced processing of data character runs.

Referring to FIG. 11, where like reference numerals indicate like components with respect to FIG. 2 and with continued reference to FIG. 2, an addition to FIG. 2 for providing enhanced processing of data character runs is illustrated. A block 150 schematically represents the run detection and processing of the compressor of said U.S. Pat. No. 6,188,333 which is incorporated herein in its entirety. The compression apparatus of the block 150 communicates with the controller 60 via a bus 151 and provides compressed codes at an output 152. The compressor 150 utilizes the input buffer 10 and the shift control 11 to provide the input look-ahead data required by the apparatus 150. In the embodiment of FIG. 11, data character runs are processed by the apparatus 150 while non-run input data is processed by the above-described embodiment of FIG. 2.

It is appreciated from the above that in a longest match compression cycle of FIG. 8, one or more AND-gates are enabled with one AND-gate enabled at each consecutive virtual level beginning with level 1. An AND-gate with virtual level k represents a string having k+1 characters with a k character prefix and an extension character from stage k+1 of the input buffer.

Although the above embodiments of the present invention are explained in terms of the matrix switches 18 and 19, other coupling arrangements may alternatively be utilized to effect the above described connections.

The above flow charts are explained in terms of sequential operations. It is appreciated that some of the operations can be performed simultaneously, for example, in the following block groupings: FIG. 6, blocks 100–103; FIG. 7, blocks 110–112; FIG. 8, blocks 121–124; FIG. 10, blocks 145,146.

It is appreciated that the embodiments of the present invention do not utilize a dictionary or string table for storing and searching previously encountered strings thereby eliminating the disadvantages, such as hash or sibling list searching, that are attendant prior art designs.

It is appreciated that the data character stream corresponding to the compressed code output provided by the above-described embodiments can be recovered by an LZW decompressor that is compatible with the protocols described above. Particularly, the decompressor should accommodate the protocols represented by the YES branch of block 122 of FIG. 8 bypassing blocks 123–125 and by the code reassignment protocols of FIG. 9.

Although the above disclosed embodiments are described generally utilizing LZW data compression protocols, it is appreciated that the architecture of the present invention can be readily utilized with other data compression protocols such as, for example, LZ2. Furthermore, the code reassignment feature described above can also be utilized in the data compressors of said Ser. No. 10/195,795; Ser. No. 10/271,196 and Ser. No. 10/351,210.

The embodiments of the present invention are substantially universal with respect to alphabet size. With N as the largest character value in an N+1 character alphabet, smaller alphabets are accommodated by adjusting the codes stored in the code and level assignment table 80. For example, if N is 255 in an ASCII alphabet, the first assignable code N+3 may be 258. If N is 3 in a 4 character alphabet, the first assignable code N+3 may be 6. Of course a sufficient number of AND-gates should be included in the design to accommodate the assignable codes.

In selecting the number of stages in which to implement the input character buffer 10, the statistics of the input data can be analyzed to choose an appropriate number of stages so as to optimize performance. The number of stages can be chosen so that there will usually be a mismatching character in the buffer so that an extended string can be recorded in the string matrix 40. The number of virtual levels should be consistent with the length of the input buffer.

It is further appreciated that the input data characters can be over any size alphabet having any corresponding character bit size. For example, the data characters can be textual data, image pixel data or bit map data. The input data can also be binary characters over the two-character binary alphabet 1 and 0 having a 1-bit size character.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. Apparatus for reassigning string codes in a data compressor that compresses an input stream of data characters into an output stream of compressed codes, comprising a plurality of coincidence elements corresponding to a respective plurality of codes to be assigned to strings, a string being comprised of a prefix string of at least one of said data characters followed by an extension character, a prefix string having a prefix code associated therewith, each coincidence element providing a coincidence output and having a prefix code input and a character input for enabling the coincidence element to energize the coincidence output thereof upon coincidental energization of the inputs thereof so that energization of a coincidence output of a coincidence element provides a representation of the code corresponding thereto, first coupling means for selectively coupling the representations of codes corresponding to the coincidence elements to the prefix code inputs of the coincidence elements, second coupling means for selectively coupling representations of data characters fetched from said input stream to the character inputs of the coincidence elements, means for recording extended strings in said coincidence elements, an extended string comprising a longest matching string extended by the data character following said longest matching string, and means for reassigning a coincidence element to an extended string to be recorded when further codes are unavailable for assignment.

2. The apparatus of claim 1 wherein said first coupling means comprises means for selectively coupling the coincidence outputs of the coincidence elements to the prefix code inputs of the coincidence elements.

3. The apparatus of claim 2 wherein said means for reassigning comprises means for reassigning a particular coincidence element to an extended string to be recorded if the coincidence output of said particular coincidence element is not coupled to the prefix code input of another coincidence element.

4. The apparatus of claim 3 wherein said means for reassigning includes means for selectively applying enable signals to the inputs of said coincidence elements so that if said coincidence output of said particular coincidence element is coupled to the prefix code input of another coincidence element, said another coincidence element is enabled, and means for determining if said another coincidence element is enabled.

5. The apparatus of claim 3 wherein said means for reassigning includes means for applying enable signals to the prefix code and character inputs of said particular coincidence element, means for selectively applying enable signals to the character inputs of further coincidence elements so that if the coincidence output of said particular coincidence element is coupled to the prefix code input of another coincidence element, said another coincidence element is enabled, and means for determining if said another coincidence element is enabled.

6. The apparatus of claim 5 wherein said means for reassigning includes means for decoupling connections in said first and second coupling means of said prefix code and character inputs, respectively, of said particular coincidence element, if said coincidence output of said particular coincidence element is not coupled to the prefix code input of another coincidence element, so that said particular coincidence element can be reassigned to said extended string to be recorded.

7. The apparatus of claim 5 further including means for assigning levels to said coincidence elements, a level assigned to a coincidence element indicative of the number of characters of a string recorded thereby, said further coincidence elements having an assigned level that is one level greater than the level assigned to said particular coincidence element.

8. The apparatus of claim 7 wherein said means for assigning levels includes a code and level assignment table having locations for storing codes corresponding to said coincidence elements and the levels assigned thereto.

9. The apparatus of claim 3 wherein said means for reassigning includes means for applying enable signals to the prefix code and character inputs of said particular coincidence element through said first and second coupling means, respectively, means for selectively applying enable signals through said second coupling means to the character inputs of further coincidence elements so that if the coincidence output of said particular coincidence element is coupled to the prefix code input of another coincidence element, said another coincidence element is enabled, and means for determining if said another coincidence element is enabled.

10. The apparatus of claim 9 wherein said data compressor further includes means for fetching a plurality of data characters from said input stream and applying said fetched characters to said second coupling means so as to enable a coincidence element corresponding to a code assigned to a string that is the longest match to said plurality of data characters, and means for outputting the code of said longest matching string, thereby providing said stream of compressed codes.

11. The apparatus of claim 10 wherein said first coupling means is operative for coupling the representation of the code assigned to said longest matching string to the prefix code input of the coincidence element corresponding to the next code to be assigned to a string, and said second coupling means is operative for coupling the representation of the fetched data character following said longest matching string to the character input of said coincidence element corresponding to said next code to be assigned, so as to record, in said coincidence element corresponding to said next code, an extended string comprising the prefix string having the code of said longest matching string and the extension character comprising said data character following said longest matching string, thereby assigning said next code to said extended string.

12. The apparatus of claim 11 wherein said first coupling means comprises prefix code switch means for selectively coupling the coincidence outputs of the coincidence elements to the prefix code inputs thereof.

13. The apparatus of claim 12 wherein said prefix code switch means comprises a matrix switch.

14. The apparatus of claim 12 wherein said first coupling means further includes a code decoder responsive to a first character of a string under test for providing a plurality of outputs corresponding to respective character values, a unique decoder output being energized in accordance with a character value of said first character, said outputs of said code decoder providing representations of codes corresponding to said character values to said prefix code switch means.

15. The apparatus of claim 11 wherein said second coupling means includes character switch means for selectively coupling said representations of data characters to the character inputs of the coincidence elements.

16. The apparatus of claim 15 wherein said character switch means comprises a matrix switch.

17. The apparatus of claim 15 wherein said data characters are from an alphabet of data characters and wherein said second coupling means includes a plurality of character decoders responsive respectively to said plurality of fetched characters, each character decoder providing a plurality of outputs corresponding to the respective characters of said alphabet, a unique decoder output being energized in accordance with the character applied to the character decoder, the outputs of said plurality of character decoders providing said representations of data characters to said character switch means.

18. The apparatus of claim 17 wherein said means for fetching comprises an input buffer for holding said plurality of data characters fetched from said input stream and for applying said fetched characters to said character decoders, respectively, and means for shifting said plurality of data characters in said input buffer so that the fetched data character following said longest matching string is shifted to a first stage of said input buffer so as to provide the first character of a next longest match.

19. The apparatus of claim 18 further including means for assigning levels to said coincidence elements, a level assigned to a coincidence element indicative of a number of characters of a string recorded thereby, said further coincidence elements having an assigned level that is one level greater than the level assigned to said particular coincidence element, the level assigned to said further coincidence elements being indicative of particular inputs of said character switch means that are coupled to said character inputs of said further coincidence elements, said enable signals applied to said character inputs of said further coincidence elements being applied through said particular inputs of said character switch means.

20. The apparatus of claim 11 further including means for assigning levels to said coincidence elements, a level assigned to a coincidence element indicative of a number of characters of a string recorded thereby, and wherein said means for fetching comprises an input buffer for holding said plurality of data characters fetched from said input stream, the level assigned to the coincidence element corresponding to said longest matching string being indicative of the stage of said input buffer holding said fetched data character following said longest matching string.

21. The apparatus of claim 2 wherein said means for reassigning comprises means for reassigning a particular coincidence element to an extended string to be recorded if the coincidence output of said particular coincidence element is not coupled to the prefix code input of another coincidence element through said first coupling means.

22. The apparatus of claim 1 wherein said plurality of coincidence elements comprises a matrix of AND-gates.

23. A method for reassigning string codes in a data compressor that compresses an input stream of data characters into an output stream of compressed codes, comprising providing a plurality of coincidence elements corresponding to a respective plurality of codes to be assigned to strings, a string being comprised of a prefix string of at least one of said data characters followed by an extension character, a prefix string having a prefix code associated therewith, each coincidence element providing a coincidence output and having a prefix code input and a character input for enabling the coincidence element to energize the coincidence output thereof upon coincidental energization of the inputs thereof so that energization of a coincidence output of a coincidence element provides a representation of the code corresponding thereto, selectively coupling through first coupling means, the representations of codes corresponding to the coincidence elements to the prefix code inputs of the coincidence elements, selectively coupling through second coupling means, representations of data characters fetched from said input stream to the character inputs of the coincidence elements, recording extended strings in said coincidence elements, an extended string comprising a longest matching string extended by the data character following said longest matching string, and reassigning a coincidence element to an extended string to be recorded when further codes are unavailable for assignment.

24. The method of claim 23 wherein said step of selectively coupling through first coupling means comprises selectively coupling, through first coupling means, the coincidence outputs of the coincidence elements to the prefix code inputs of the coincidence elements.

25. The method of claim 24 wherein said reassigning step includes reassigning a particular coincidence element to an extended string to be recorded if the coincidence output of said particular coincidence element is not coupled to the prefix code input of another coincidence element.

26. The method of claim 25 wherein said reassigning step includes selectively applying enable signals to the inputs of said coincidence elements so that if said coincidence output of said particular coincidence element is coupled to the prefix code input of another coincidence element, said another coincidence element is enabled, and determining if said another coincidence element is enabled.

27. The method of claim 25 wherein said reassigning step includes applying enable signals to the prefix code and character inputs of said particular coincidence element, selectively applying enable signals to the character inputs of further coincidence elements so that if the coincidence output of said particular coincidence element is coupled to the prefix code input of another coincidence element, said another coincidence element is enabled, and determining if said another coincidence element is enabled.

28. The method of claim 27 wherein said reassigning step includes decoupling connections in said first and second coupling means of said prefix code and character inputs, respectively, of said particular coincidence element, if said coincidence output of said particular coincidence element is not coupled to the prefix code input of another coincidence element, so that said particular coincidence element can be reassigned to said extended string to be recorded.

29. The method of claim 27 further including assigning levels to said coincidence elements, a level assigned to a coincidence element indicative of a number of characters of a string recorded thereby, said further coincidence elements having an assigned level that is one level greater than the level assigned to said particular coincidence element.

30. The method of claim 27 wherein said data compressor is operative for fetching a plurality of data characters from said input stream and applying said fetched characters to said second coupling means so as to enable a coincidence element corresponding to a code assigned to a string that is a longest match to said plurality of data characters, and outputting the code of said longest matching string, thereby providing said stream of compressed codes.

31. The method of claim 30 further including coupling, through said first coupling means, the representation of the code assigned to said longest matching string to the prefix code input of the coincidence element corresponding to a next code to be assigned to a string, and coupling, through said second coupling means, the representation of the fetched data character following said longest matching string to the character input of said coincidence element corresponding to said next code to be assigned, so as to record, in said coincidence element corresponding to said next code, an extended string comprising the prefix string having the code of said longest matching string and the extension character comprising said data character following said longest matching string, thereby assigning said next code to said extended string.

32. The method of claim 31 wherein said fetching step includes utilizing an input buffer for holding said plurality of data characters fetched from said input stream, and shifting said plurality of data characters in said input buffer so that the fetched data character following said longest matching string is shifted to a first stage of said input buffer so as to provide the first character of a next longest match.

33. The method of claim 31 further including assigning levels to said coincidence elements, a level assigned to a coincidence element indicative of the number of characters of a string recorded thereby, and wherein said fetching step comprises utilizing an input buffer for holding said plurality of data characters fetched from said input stream, the level assigned to the coincidence element corresponding to said longest matching string being indicative of the stage of said input buffer holding said fetched data character following said longest matching string.

34. The method of claim 23 wherein the step of providing said plurality of coincidence elements comprises providing a plurality of AND-gates.

* * * * *